(12) United States Patent  (10) Patent No.: US 8,034,540 B2
Zwadlo                     (45) Date of Patent:       *Oct. 11, 2011

(54) SYSTEM AND METHOD EMPLOYING SECONDARY BACK EXPOSURE OF FLEXOGRAPHIC PLATE

(75) Inventor: Gregory L. Zwadlo, River Falls, WI (US)

(73) Assignee: Eastman Kodak Company, Rochester, NY (US)

( * ) Notice: Subject to any disclaimer, the term of this patent is extended or adjusted under 35 U.S.C. 154(b) by 386 days.

This patent is subject to a terminal disclaimer.

(21) Appl. No.: 12/183,173

(22) Filed: Jul. 31, 2008

(65) Prior Publication Data

US 2010/0028815 A1  Feb. 4, 2010

(51) Int. Cl.
*G03F 7/00* (2006.01)
*G03F 7/36* (2006.01)
*G03F 1/00* (2006.01)

(52) U.S. Cl. ........ 430/306; 430/253; 430/254; 430/256; 430/5

(58) Field of Classification Search .................. 430/306; 101/450.1
See application file for complete search history.

(56) References Cited

U.S. PATENT DOCUMENTS

| | | | |
|---|---|---|---|
| 4,046,071 A * | 9/1977 | Mizuno et al. | 101/395 |
| 4,927,723 A * | 5/1990 | Cusdin | 430/15 |
| 5,455,416 A | 10/1995 | Zertani et al. | |
| 5,552,263 A | 9/1996 | Schober et al. | |
| 5,813,342 A | 9/1998 | Strong | |
| 5,850,789 A * | 12/1998 | Rudolf et al. | 101/486 |
| 6,855,482 B2 | 2/2005 | McLean et al. | |
| 7,126,724 B2 * | 10/2006 | McCrea et al. | 358/3.3 |
| 7,245,402 B2 * | 7/2007 | McCrea et al. | 358/3.3 |
| 7,279,254 B2 | 10/2007 | Zwadlo | |
| 2004/0177782 A1 | 9/2004 | McCrea et al. | |
| 2005/0227182 A1 | 10/2005 | Ali et al. | |
| 2006/0257780 A1 * | 11/2006 | Zwadlo | 430/270.1 |
| 2007/0014929 A1 | 1/2007 | Eggers | |

FOREIGN PATENT DOCUMENTS

EP 0 295 818 A2 12/1988

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

A method of making a relief image on a flexographic print plate including imagewise exposing a mask including an imageable material disposed on a mask substrate to form an imaged mask having a mask image in the imageable material disposed on the mask substrate, the mask image including mask image areas each having a highlight value. The method further includes laminating the imaged mask to a front surface of a flexographic printing plate precursor, and exposing selected areas of the flexographic printing plate precursor to an imagewise addressable curing radiation via a back surface of the flexographic printing plate precursor based on the highlight values of corresponding mask image areas of the mask image.

15 Claims, 8 Drawing Sheets 122  120

SYSTEM AND METHOD EMPLOYING SECONDARY BACK EXPOSURE OF FLEXOGRAPHIC PLATE

FIELD OF THE INVENTION

Embodiments relate generally to a system and method of forming a relief image on a flexographic printing plate and more particularly to a system and method employing secondary back exposure of a flexographic printing plate precursor.

BACKGROUND OF THE INVENTION

Flexographic printing is a method of direct rotary printing that uses a resilient relief image in a plate of rubber or photopolymer (i.e. a flexographic printing plate) to print articles such as cartons, bags, labels or books. Flexographic printing has found particular application in packaging, where it has displaced rotogravure and offset lithography printing techniques in many cases. While the quality of articles printed using flexographic plates has improved significantly as the technology has matured, physical limitations related to the process of creating a relief image in the flexographic printing plate remain.

In particular, it is very difficult to print small graphic elements such as fine dots, lines, and even text using flexographic printing plates. In the lightest areas of an image (commonly referred to as highlights), the density of the image is represented by the total area of dots in a halftone screen representation of a continuous tone image. Due to the nature of the plate making processes, maintaining small dots on a flexographic printing plate is very difficult. In a pre-imaging (or post-imaging) step the floor of the printing plate is set by area exposure to ultraviolet light from the back of the printing plate. This exposure hardens the photopolymer to a desired relief depth for optimal printing. Floodwise exposure to image-forming radiation via a mask layer followed by a processing step to remove unhardened (i.e. unexposed) photopolymer produces relief dots having a generally conical shape.

The smallest of these dots are prone to be removed during processing, which means no ink is transferred to those areas during printing (the dot is not "held" on plate and/or on press). Alternatively, even if the smallest dots survive processing, they are susceptible to damage on the rotary printer, as small dots often fold over and/or partially break off during printing causing either excess ink or no ink to be transferred.

There remains a need to improve retention of small dots in flexographic printing processes.

SUMMARY OF THE INVENTION

One embodiment provides a method of making a relief image on a flexographic print plate including imagewise exposing a mask including an imageable material disposed on a mask substrate to form an imaged mask having a mask image in the imageable material disposed on the mask substrate, the mask image including mask image areas each having a highlight value. The method further includes laminating the imaged mask to a front surface of a flexographic printing plate precursor, and exposing selected areas of the flexographic printing plate precursor to an imagewise addressable curing radiation via a back surface of the flexographic printing plate precursor based on the highlight values of corresponding mask image areas of the mask image.

One embodiment provides a system for forming a relief image on a flexographic print plate including a laminator, a main exposure unit, and a secondary exposure unit. The laminator is configured to laminate an imaged mask having a mask image to a front surface of a flexographic printing plate precursor, the mask image having mask image areas each having a highlight value. The main exposure unit is configured to expose the flexographic printing plate precursor to curing radiation through the imaged mask, and the secondary exposure unit is configured to expose selected areas of the flexographic printing plate precursor to curing radiation via a back surface of the flexographic printing plate precursor based on highlight values of corresponding mask image areas of the mask image.

One embodiment provides a method of forming a relief image on a flexographic print plate including laminating an imaged mask having a mask image to a front surface of a flexographic printing plate precursor, the mask image having mask image areas each having a highlight value, and exposing selected areas of the flexographic printing plate precursor to an imagewise addressable curing radiation via a back surface of the flexographic printing plate precursor based on highlight values of corresponding mask image area of the mask image.

DETAILED DESCRIPTION OF THE INVENTION

Figure 1:
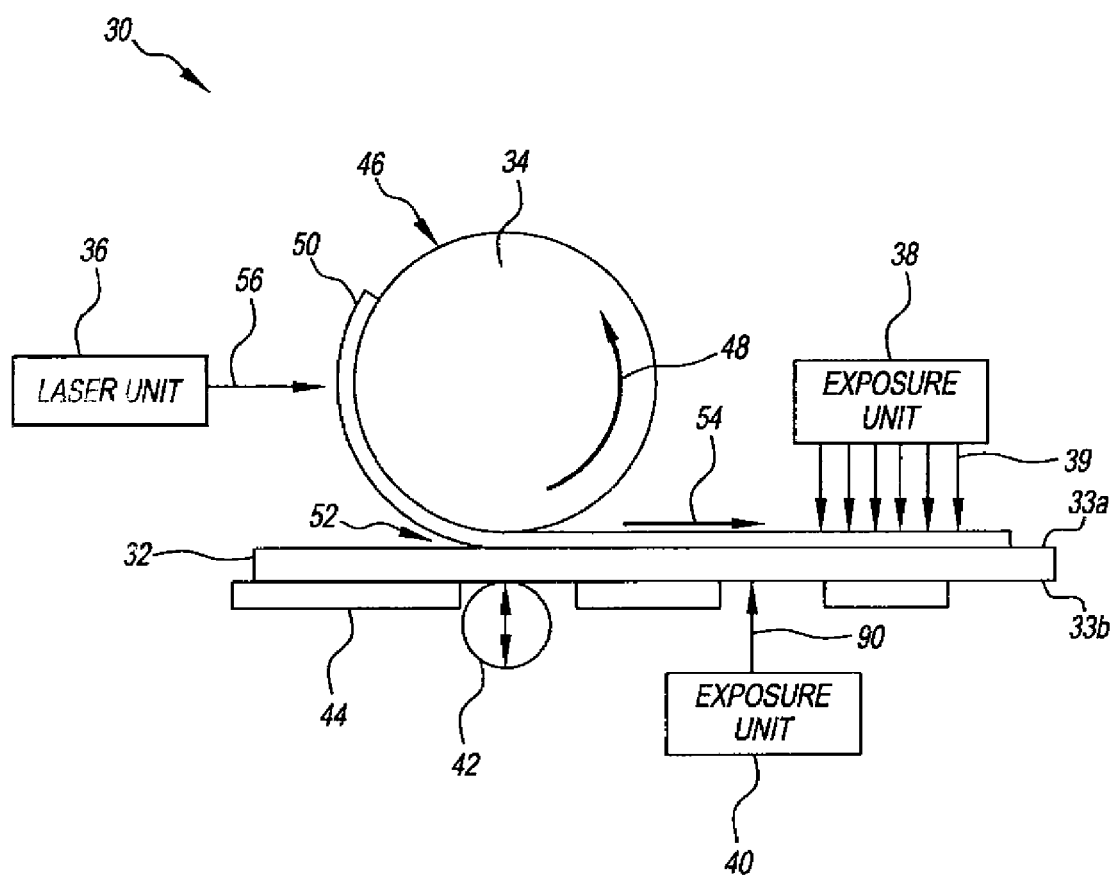
FIG. 1 is block diagram illustrating a system for making a relief image on a flexographic printing plate according to one embodiment.

FIG. 1 is a block diagram generally illustrating one embodiment of a system 30 for making an article bearing a relief image, such as a flexographic printing plate, from a flexographic printing plate precursor 32. According to one embodiment, system 30 includes a rotating imaging drum 34, a laser unit 36, a main exposure unit 38, a secondary back exposure unit 40, a contact idler roller 42, and a transport bed 44. As illustrated, main and secondary back exposure units 38 and 40 are respectively positioned proximate to a front surface 33a and a back surface 33b of flexographic printing plate precursor 32.

In operation, according to one embodiment, imaging drum 34 receives and secures an imageable mask 50 against an outside surface 46 (e.g. via a vacuum-hold system). As imaging drum 34 is driven to rotate is a direction as indicated by rotational arrow 48 (e.g. counter clockwise in FIG. 1), mask 50 moves along outside surface 46 and past laser unit 36 until merging with flexographic printing plate precursor 32 at a nip 52 formed by imaging drum 34 and contact idler roller 42. As will be described in greater detail below, according to one embodiment, flexographic printing plate precursor 32 a layer having adhesive properties so that mask 50 is adhesively laminated to flexographic printing plate precursor 32 as they simultaneously pass through nip 52. Subsequently, continued rotation of imaging drum 34 moves the laminated combination of flexographic printing plate precursor 32 and mask 50 along transport bed 44 past secondary back exposure unit 40 and main exposure unit 38, as indicated by directional arrow 54.

The operation of laser unit 36, main exposure unit 38, and secondary back exposure unit 40 with respect to mask 50 for the formation of a relief image on flexographic printing plate precursor 32 is described in greater detail below.

Figure 2A:
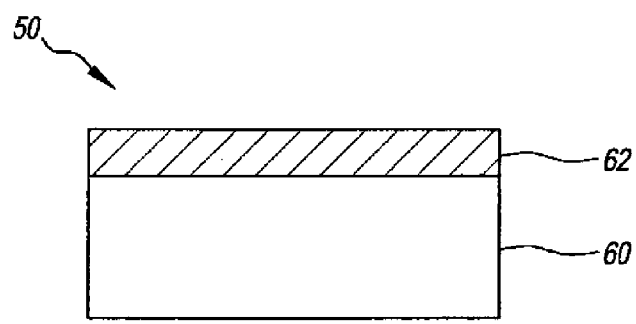
FIG. 2A is a block diagram illustrating one embodiment of a mask suitable for use with the system of FIG. 1.
Figure 2B:
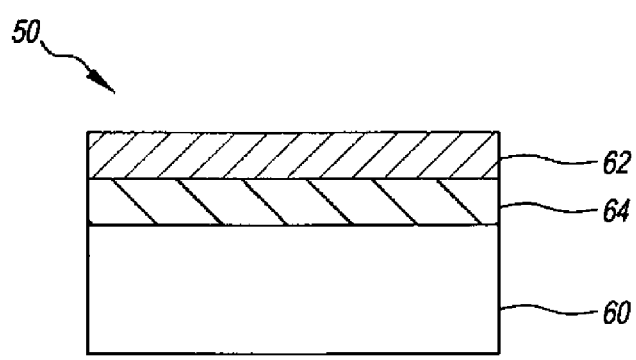
FIG. 2B is a block diagram illustrating one embodiment of a mask suitable for use with the system of FIG. 1.
Figure 2C:
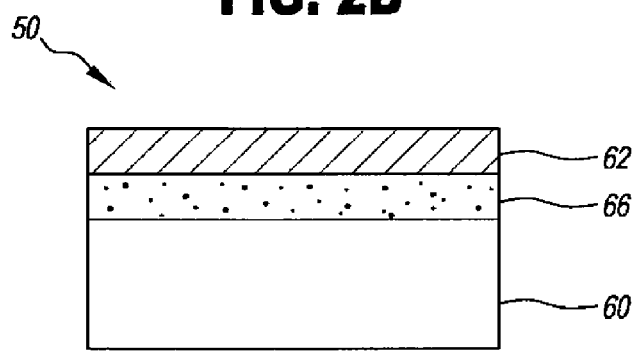
FIG. 2C is a block diagram illustrating one embodiment of a mask suitable for use with the system of FIG. 1.
Figure 2D:
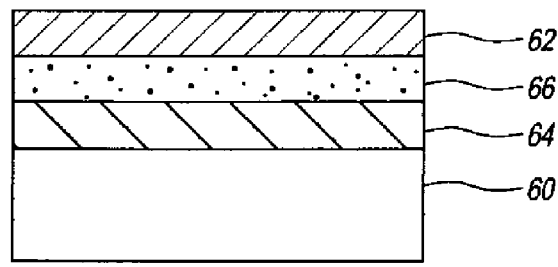
FIG. 2D is a block diagram illustrating one embodiment of a mask suitable for use with the system of FIG. 1.

According to one embodiment, as illustrated by FIG. 2A, mask 50 comprises an imageable film including at least a mask substrate 60 and an imageable material 62 which comprises a relatively uniform coating of one or more layers disposes on substrate 60. In another embodiment, as illustrated by FIG. 2B, mask 50 includes a subbing layer 64 disposed on mask substrate 60 and imageable material 62 disposed on subbing layer 64. In another embodiment, as illustrated by FIG. 2C, mask 50 includes an ablatable layer 66 disposed on substrate 60 and imageable material 62 disposed on ablatable layer 66. In yet another embodiment, as illustrated by FIG. 2D, mask 50 includes subbing layer 64 disposed on mask substrate 60, ablatable layer 66 disposed on subbing layer 64, and imageable material 62 disposed on ablatable layer 66.

Figure 3:
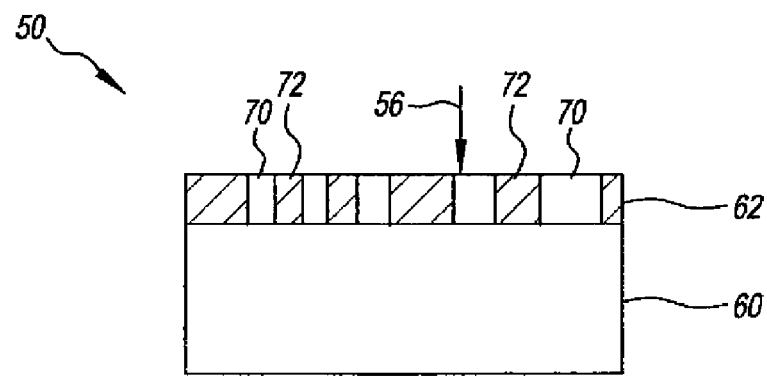
FIG. 3 is block diagram illustrating a mask being imagewise exposed according to one embodiment.

As illustrated by FIG. 3, and with further reference to FIG. 1, according to one embodiment, as mask 50 passes laser unit 36, laser unit 36 imagewise exposes mask 50 to laser radiation from a laser, such as a laser beam 56, which is focused to impinge on imageable material 62. Laser beam 56 is scanned or rasterized under computer control over mask 50 while the output of laser beam 56 is modulated in accordance with electronically stored data representative of a desired image to produce exposed areas 70 and unexposed areas 72 in imageable material 62 of mask 50. According to one embodiment, as mask 50 is exposed to imaging radiation, such as laser beam 56, the radiation is absorbed by an energy absorber in imageable material 62, and in ablatable layer 66 if included in mask 50, and causes transfer of imageable material 62 from mask substrate 60 in areas 70 exposed to the imaging radiation. An example of such a process is described in U.S. Pat. No. 5,935,758 to Patel, et al., which is hereby incorporated by reference.

Following exposure to the imaging radiation, imageable material 62 and other layers remaining on mask substrate 60 (e.g. ablatable layer 66) together form what is referred to as a "mask image". The combination of the mask image and mask substrate 60 is referred to as the imaged mask. A process of forming a mask image is also described in U.S. patent application Ser. No. 11/081,018, which also incorporated herein by reference.

The components of mask 50 are described briefly below. A more detailed description of such components suitable for use with mask 50 is provided by U.S. Pat. No. 7,279,254 to Zwadlo, which is hereby incorporated by reference.

Mask substrate 60 may be of any suitable substrate which includes, for example, plastic sheets and films, such as polyethylene terephthalate or polyethylene naphthalate, fluorence polyester polymers, polyethylene, polypropylene, acrylics, polyvinyl chloride and copolymers thereof, and hydrolyzed and non-hydrolized cellulose acetate. Mask substrate 60 should be sufficiently transparent to a curing radiation (as will be described below), and in some instances, it may be desirable that mask substrate 60 be sufficiently transparent to imaging radiation, such as laser beam 56. Mask substrate 60 may also include an anti-static coating.

Imageable material 62 includes multiple components such as, for example, a colorant (e.g. a dye or pigment) and an energy absorber dispersed in a binder. Imageable material 62 may be disposed as a single layer or multiple layers. For example, in one embodiment, imageable material 62 may be combined with an ablative material and an absorbing material in a single layer. In other embodiments, imageable material 62 may include an energy absorbing layer, and a layer comprising ablative material adjacent to the energy absorbing layer. In other embodiments, imageable material 62 may include other components such binders for dispersing other components, fluorocarbon additives for enhancing transfer of molten or softened imageable material, suitable latent crosslinking agents, plasticizers, coating agents, UV absorbers, and fillers.

Subbing layer 64, also known as an adhesion promoter, or a scratch resistant hardcoat or hardened gelatin layer, provides optical contact after lamination (as described in greater detail below) and assists in removing the mask image from photosensitive material of flexographic plate 32 in areas of mask 50 where imageable material 62 was removed during imaging, such as by laser beam 56. Ablatable layer 66 may comprise a particulate material, such as metal-oxide particles or iron-oxide particulate, which decompose to provide propulsive gases particularly advantageous for an ablative imaging mechanism.

Methods of imagewise exposing imageable material 62 of mask 50 are conventional in the art, with both analog and digital methods of imagewise exposing mask 50 being suitable. Additionally, although described in FIG. 1 as employing an external drum scanner, other scanning devices may be employed such as, for example, flat-bed scanners, and internal drum scanners. In some embodiments, the imaging radiation may include infrared radiation. The infrared radiation may be, for example in the range of about 750-1200 nm and be provided, for example, by an infrared laser such as a diode laser (830 nm) or a Nd:YAG laser (1064 nm). According to such an embodiment, imaging material 62 includes an energy absorber that is sensitive to infrared radiation and which converts infrared radiation to heat which may then result in a physical or chemical change is a physical or chemical property. In other embodiments, imageable material 62 is exposed to visible laser light such as in the range of 400-700 nm, for example. In still other embodiments, imageable material 62 is exposed to UV radiation by laser direct imaging (LDI). A more detailed description of such imaging processes or mechanisms, including a description of imagers and equipment suitable for performing such imaging processes is provided by previously incorporated U.S. Pat. No. 7,279,254 to Zwadlo.

According to one imaging mechanism, exposed areas 70 of imaging material 62 of mask 50 are removed through ablation. With this imaging mechanism, exposed areas 70 of imaging material 62 (and of ablatable layer 66, if present) are propelled from mask substrate 60 by generation of a gas. According to such an embodiment, specific binders that decompose upon exposure to heat (e.g. laser radiation) to rapidly generate a gas may be used in imageable material 62 or in ablatable layer 66. The build-up of gas under or within exposed areas 70 of imageable material 62 creates pressure that propels imageable material 62 off of mask substrate 60 in exposed areas 70. In another ablative mode of imaging by action of a laser beam, such as laser beam 56, a layer of imageable material having a colorant, an infrared absorbing dye, and a binder is imaged, wherein energy from the laser drives off the imageable material at the spot where the laser beam impinges the imageable material. With an ablative imaging mechanism, a debris collector, such as a vacuum or suitable receptor sheet, for example, may be placed near the imageable material to retrieve or collect the exposed imageable material after it is propelled from the mask substrate.

Other imaging mechanisms may be also be suitable to imagewise expose imaging material 62 of mask 50 including, for example, laser-induced film transfer, a peel-apart mechanism, and dye sublimation or diffusion. These imaging mechanisms, along with ablating mechanisms, are described in greater detail by previously incorporated U.S. Pat. No. 7,279,254 to Zwadlo.

Figure 4:
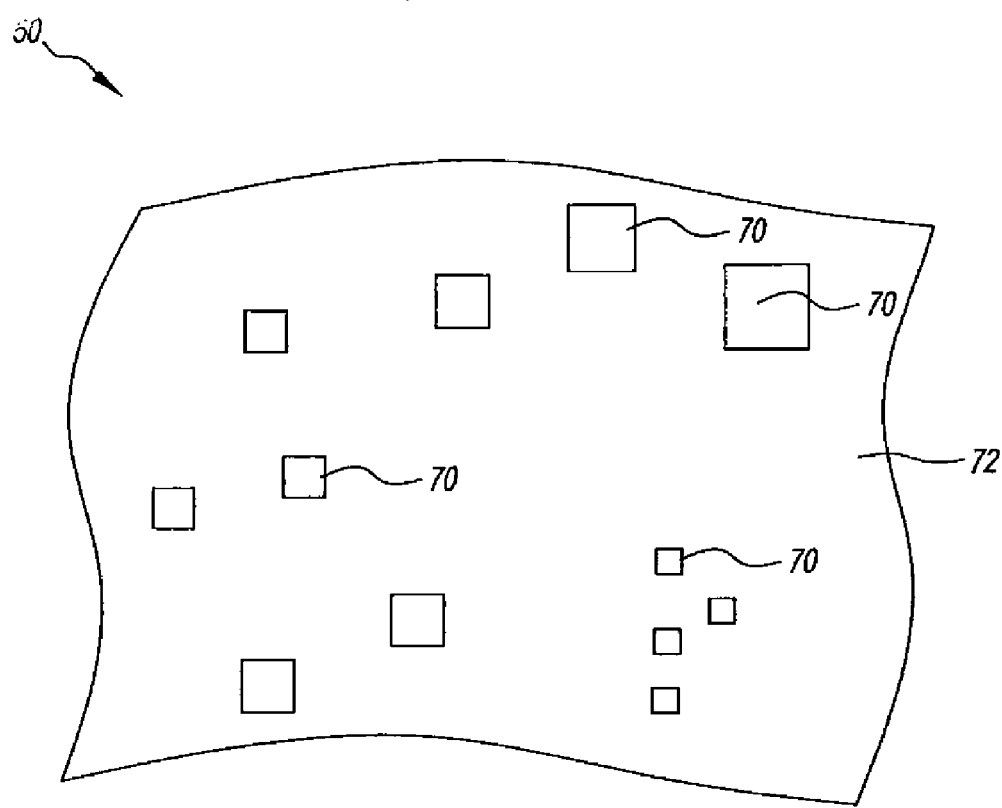
FIG. 4 is a top view of an example portion of a mask after being imagewise exposed according to one embodiment.

Returning to FIG. 3, it is noted that exposed areas 70 are of different sizes or areas. For example, with respect to FIG. 3, exposed areas 70 at the right-hand side of mask 50 are of a smaller size than exposed areas 70 at the left-hand side of mask 50. FIG. 4 is a top view of an example portion of mask 50 after being imagewise exposed by laser unit 36 (e.g. using an ablating mechanism). Again it is noted that exposed areas 70 are of varying sizes. As described in greater detail below, and according to conventionally known techniques, curing radiation 39 provided by main exposure unit 38 passes through exposed areas 70 (see FIGS. 1 and 7) which, together with a developing process, create conical-shaped "highlight dots" on a flexographic printing plate 32' formed from flexographic printing plate precursor 32. Together, the highlight dots form a desired relief image on flexographic printing plate 32', wherein the varying sizes of exposed areas 70 create varying sizes of highlight dots in the relief image.

In the lightest areas of an image to be printed using flexographic printing plate 32' (commonly referred to a highlights), the density of the image is represented by the total area of highlight dots in a halftone screen representation of a continuous tone image. Different sized highlight dots correspond to different tone densities. For example, in an area where no density is desired (0% tone), there are no highlight dots, while highlight dots for a 10% tone will be of a larger size than highlight dots for a 5% tone. Based on this correspondence, the sizes of highlight dots are commonly referred to in terms of the tone values to which they correspond, such as 5% highlight dots or 10% highlight dots, for example.

For example, with reference to FIG. 4, the smallest highlight dots may represent 1% highlight dots while the largest highlight dots may represent 10% highlight dots. Because of the correspondence between highlight dots, the sizes of exposed areas 70 of mask 50 are also referred to in terms of a tone percentage. This percentage is also sometimes referred to as a highlight value. As known, the smaller the size of the exposed areas 70 of the mask image, the more difficult it is to effectively form the corresponding highlight dot in the relief image of flexographic printing plate 32'.

Figure 5:
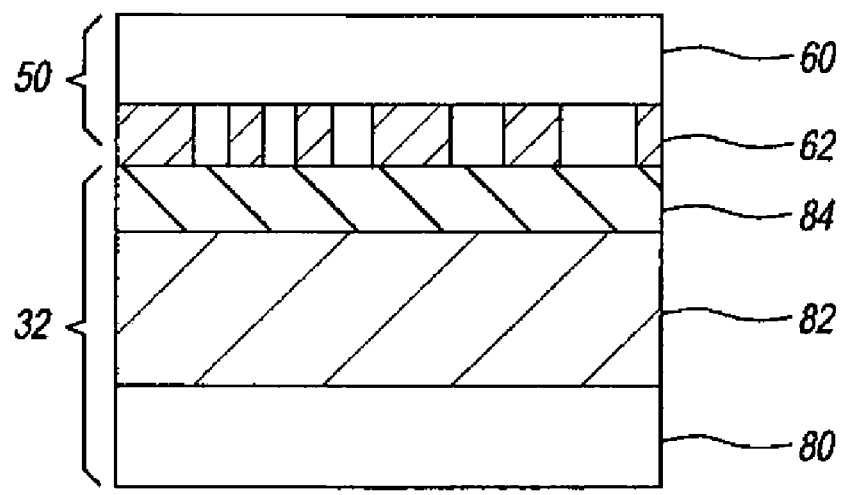
FIG. 5 is a block diagram illustrating a mask laminated to a flexographic printing plate precursor according to one embodiment.

Referring again to FIG. 1, according to one embodiment, after the mask image has been formed on mask 50, continued rotation of imaging drum drives mask 50 through nip 52 along with flexographic printing plate precursor 32 so that imaging material 60 of mask 50 is adhered or laminated to front surface 33a of flexographic printing plate precursor 32. FIG. 5 is a block diagram illustrating mask 50 after being laminated to flexographic printing plate precursor 32. According to one embodiment, mask 50 is laminated to flexographic printing plate precursor 32 through application of pressure, such as that applied by nip 52. In other embodiments, mask 50 may be laminated to flexographic printing plate precursor 32 by application on heat. Laminating may also include application of both heat and pressure to flexographic printing plate precursor 32 and mask 50.

Additionally, in lieu of employing imaging drum 34 and pressure roller 42 to laminate mask 50 with flexographic printing plate precursor 32, commercially available laminators which provide both heat and pressure may be used. Suitable laminators include, for example, KODAK model 880XL APPROVAL LAMINATOR, available from Eastman Kodak Co. (Rochester, N.Y.), and CODOR LPP650 LAMINATOR from COROR laminating systems (Amsterdam, Holland).

As illustrated, according to one embodiment, flexographic printing plate precursor 32 includes a photosensitive substrate 80, a photosensitive material 82, and a releasing layer 84, with imaging material 62 of mask 50 being laminated to flexographic printing plate precursor 32 via releasing layer 84. According to one embodiment, flexographic printing plate 32' results from flexographic printing plate precursor 32 after the mask image of mask 50 is formed as a relief image thereon.

According to embodiments, photosensitive material 82 may be either positive working or negative working. A negative working photosensitive material hardens or is curable by exposure to a curing radiation and generally includes a polymer or pre-polymer that polymerizes or crosslinks upon exposure to the curing radiation. In one embodiment, photosensitive material 82 comprises an ultra-violet curable resin which may also include an elastomeric binder, at least one monomer and a photoinitiator, where the initiator has a sensitivity to non-infrared radiation. In most cases, the initiator will be sensitive to ultraviolet or visible radiation or both. The elastomeric binder may be a single polymer or a mixture of polymers which may be soluble, swellable or dispersible in aqueous, semi-aqueous or organic solvent developers. The monomer may comprise a single monomer or a mixture of monomers which are compatible with the binder to the extent that a clear, non-cloudy photosensitive layer is produced. The photoinitiator may be any single compound or combination of compounds which is sensitive to ultraviolet radiation, generating free radicals which initiate the polymerization of the monomer or monomers without excessive termination. The photoinitiator should be sensitive to visible or ultraviolet radiation, and may also be insensitive to infrared and/or visible radiation and should be thermally inactive at and below 185° C. The ultraviolet curable resin maybe contain other additives depending on the final properties desired, such as sensitizers, plasticizers, rheology modifiers, thermal polymerization inhibitors, tackifiers, colorants, antioxidants, antiozonants, or fillers, for example.

A thickness of photosensitive material 82 (e.g. the ultraviolet curable resin) may vary depending upon the desired type of flexographic printing plate 32. In one embodiment, the ultraviolet curable resin may be, for example, from about 20-250 mils (500-600 microns) or greater in thickness and, more particularly, from about 20-100 mils (500-2500 microns) in thickness. According to one embodiment, flexographic printing plate 32 comprises a flexographic printing plate precursor commercially available as FLEXCEL NX from Kodak Polychrome Graphics (Norwalk, Conn.). In one embodiment, flexographic printing plate 32 comprises a flexographic printing plate precursor commercially available as FLEXCEL SRH from Kodak Polychrome Graphics (Norwalk, Conn.)

Releasing layer 84 facilitates the removal of imaged mask 50 from photosensitive material 82 subsequent to a curing process. Releasing material 84 may also provide sufficient adhesion between printing plate 32 and imaged mask 50 during the curing process. The releasing layer should not significantly absorb or scatter curing radiation and at room temperatures should allow intact removal of mask 50, but not at high temperatures. Releasing layer 84 may also protect the ultraviolet-curable resin of photosensitive material 82 from fingerprinting or other damage. Examples of coatings suitable for use as releasing layer 84 include poly(vinyl alcohol) or similar polymers, a cellulosic polymer such as methylcellulose or hydroxypropyl methylcellulose, or polyvinyl butyral or other hydroxylic polymer as described above. One particular example of releasing layer 84 is a hydrolyzed styrene maleic anhydride copolymer.

Descriptions and examples of suitable laminating techniques and of various materials and combinations of materials for flexographic printing plate 32 are provided in further detail by previously incorporated U.S. Pat. No. 7,279,254 to Zwadlo.

Figure 6:
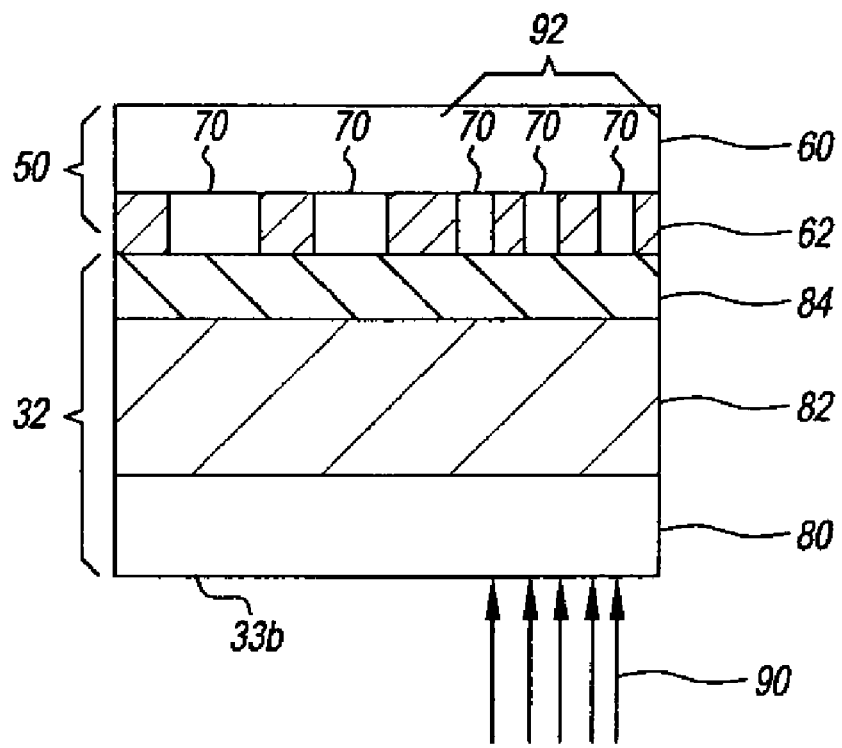
FIG. 6 is a block diagram illustrating a selected portion of the flexographic printing plate precursor of FIG. 5 being back exposed.

Referring again to FIG. 1, after mask 50 is laminated to front surface 33a of flexographic printing plate precursor 32, continued rotation of imaging drum 34 moves the laminated combination along transport bed 44 first past secondary back exposure unit 40 and then past main exposure unit 38. According to one embodiment, as illustrated by FIG. 6, as back surface 33b of flexographic printing plate precursor 32 moves past second back exposure unit 40, secondary back exposure unit 40 selectively exposes selected areas or regions of photosensitive substrate 80 of flexographic printing plate precursor 32 to a curing radiation 90 via back surface 33b. According to one embodiment, curing radiation 90 comprises ultraviolet radiation.

According to one embodiment, prior to being laminated with imaged mask 50, back surface 33b of flexographic printing plate precursor 32 is first exposed to a curing radiation via photosensitive substrate 80 so as to prepare a thin, uniform cured layer in photosensitive material 82 adjacent to photosensitive substrate 80, a process commonly referred to as "back-exposure." As described below, this thin, uniform cured layer is sometimes referred to as a "floor" of the relief image in photosensitive material 82 of the resulting flexographic printing plate (see FIG. 9). Accordingly, curing radiation 90 provided by secondary back exposure unit 40 increases a thickness of the cured layer of photosensitive material layer 82 in the selected regions (i.e. raises the floor or reduces the relief of the resulting relief image in the selected regions).

According to one embodiment, the selected regions exposed by secondary back exposure unit 40 correspond to areas of the mask image of mask 50 where exposed areas 70 have a highlight value at or below a highlight value threshold. In one embodiment, backside exposure unit 40 is in register with or indexed to imaged mask 50 and, based on the electronically stored data employed to produce exposed areas 70 and unexposed areas 72 in the formation of the mask image, secondary back exposure unit 40 exposes those areas having a highlight value at or below the highlight threshold value to curing radiation 90.

According to one embodiment, for instance, secondary back exposure unit 40 provides exposure radiation where image features (e.g. exposed areas 70) have a highlight value at or below 2%. For example, in one embodiment, with reference to FIG. 6, only an area 92 of exposed areas 70 is at or below a given highlight threshold value (e.g. 2%), while the remaining exposed areas 70 are above the highlight threshold value. As such, according to such an embodiment, only an area of back surface 33b of flexographic printing plate precursor 32 corresponding to exposed area 92 is exposed to curing radiation 90 by secondary back exposure unit 40. It is noted that the highlight threshold value may vary based on the specific requirements of a given flexographic printing plate precursor.

According to one embodiment, curing radiation 90 provided by secondary back exposure unit 40 is digitally controlled so as to expose only the selected regions of flexographic printing plate precursor 32. According to one embodiment, secondary back exposure unit 40 provides imagewise addressable curing radiation 90 via back surface 33b to expose selected region of flexographic printing plate precursor 32 based on highlight values of corresponding mask image areas of the mask image. In one embodiment, secondary back exposure unit 40 provides imagewise addressable curing radiation 90 via a plurality of individually addressable radiation sources. In one embodiment, backside exposure unit 40 comprises an array of individually addressable ultraviolet (UV) light emitting diodes (LEDs). In one embodiment, the UV LEDs are arranged to form a linear array which is positioned to extend in a transverse direction across a width of flexographic printing plate precursor 32.

Examples of commercially available linear UV LED arrays suitable for use as backside exposure unit 40 include UV LED Cure-All Linear 100 available from CON-TROL-CURE-.com, COBRA Linescan Illumination devices available from Stockeryale, Inc., and illumination devices from Opto Technology (Wheeling, Ill.). According to one embodiment, resolution and collimation of the LED array is such that exposure radiation provided by the LEDs is confined to a limited area, such as 100 spots per inch, for example.

Although described above as being a linear array of UV LEDs, secondary back exposure unit 40 may comprise any suitable type of digitally addressable light sources such as, for example, a digital light projector (DLP) having an array of individually addressable micro mirrors and an array of optical fibers coupled to individually addressable/controllable light sources.

Figure 7:
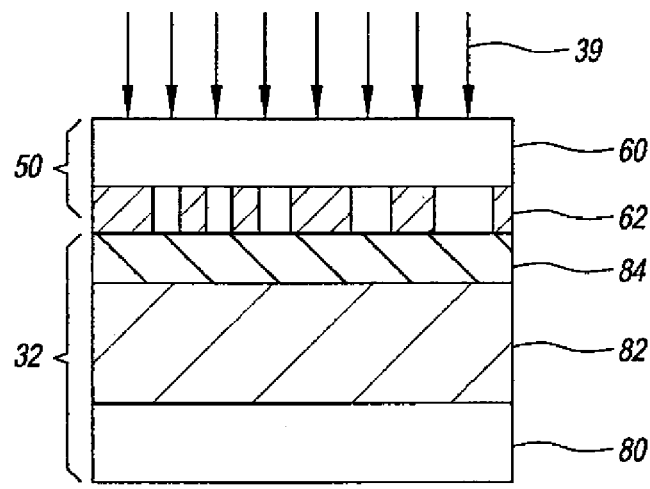
FIG. 7 is a block diagram illustrating the flexographic printing plate precursor being exposed via the mask laminated thereto according to one embodiment.

With reference to FIG. 1, after being exposed to curing radiation 90 from secondary back exposure unit 40, the laminated combination of flexographic printing plate precursor 32 and mask 50 is driven past main exposure unit 38, where, as illustrated by FIG. 7, main exposure unit 38 projects curing radiation 39 in a flood-wise fashion onto photosensitive material 82 of flexographic printing plate precursor 32 through mask 50. Curing radiation 39 is blocked by unexposed areas 72 of mask 50 and passes through exposed or unmasked areas 70 so as to impinge upon photosensitive material 82 to cause hardening or curing.

As such, the mask image should be substantially opaque to curing radiation 39, wherein substantially opaque means that the mask image should have a transmission optical density of about 2.0 or greater, and more particularly about 3.0 or greater. The unmasked or exposed areas 70 of imageable material 62 and mask substrate 60 should be substantially transparent, wherein substantially transparent means a transmission optical density of about 0.5 or less, and more particularly about 0.1 or less, even more particularly about 0.05 or less in the wavelength of curing radiation 39.

The wavelength or range of wavelengths suitable for curing radiation 39 is dictated by the nature of photosensitive material 82. According to one embodiment, curing radiation 39 comprises ultraviolet radiation. Sources of radiation for flood-wise exposure to ultraviolet radiation are conventional. Examples of suitable visible or UV sources include carbon arcs, mercury vapor arcs, fluorescent lamps, electron flash units, and photographic flood lamps. Suitable sources of LV radiation include mercury-vapor lamps, particularly sun lamps. Examples of suitable standard radiation sources for main exposure unit 38 include the SYLVANIA 350 BLACK-LIGHT fluorescent lamp and the BURGESS EXPOSURE FRAME, Model 5K-3343VSII with ADDALUX 754-18017 lamp, available from Burgess Industries, Inc. (Plymouth, Minn.). The time for exposure through mask 50 depends upon the nature and thickness of photosensitive material 82 of flexographic printing plate precursor 32.

It is noted that, due to the lamination of mask 50 to flexographic printing plate precursor 32, vacuum draw-down is not required for either the exposure of back surface 33b by secondary back exposure unit 40 or exposure of photosensitive material 82 via mask 50 by curing radiation 39 from main exposure unit 38. As a result, time required to create a vacuum is not required, and matting agents or beads, which can cause scattering of curing radiation, are not required to be part of mask 50.

Figure 8:
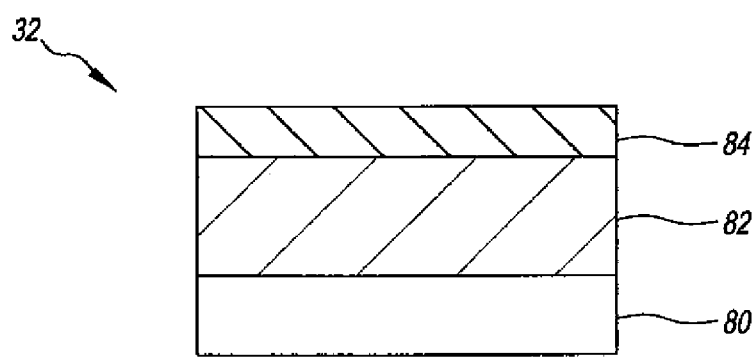
FIG. 8 is a block diagram illustrating the flexographic printing plate precursor of FIG. 7 after removal of a mask according to one embodiment.

With reference to FIG. 8, after exposure of photosensitive material 82 via mask 50, mask 50 is removed from front surface 33a of flexographic printing plate precursor 32 so that imaged mask 50 can be reused. Removing mask 50 may be done, for example, by peeling mask 50 from flexographic printing plate precursor 32. Removing mask 50 may be done manually or mechanically.

After removing or peeling off imaged mask 50, unhardened or uncured (i.e. non-exposed to curing radiation) portions of photosensitive material 82 of flexographic printing plate precursor 32 are removed by a developing process, leaving the cured portions of photosensitive material 82 which define the relief image or relief printing surface and thereby complete a transformation of flexographic print plate precursor 32 to flexographic print plate 32'. According to one embodiment, the developing process includes washing flexographic printing plate precursor 32 with a suitable developer. Suitable developers may dissolve, disperse, or swell unexposed area of photosensitive material 82. Mechanical development may also be suitable and include scrubbing or brushing flexographic printing plate precursor 32 to remove uncured or unhardened portions of photosensitive material 82. Mechanical developing means may also be used in combination with solvent developing means.

A more detailed description such a developing process, as well more detailed discussion of suitable flexographic printing plate precursors 32, and the exposing of photosensitive material 82 via imaged mask 50 by main exposure unit 38 is recited by previously incorporated U.S. Pat. No. 7,279,254 to Zwadlo.

Figure 9:
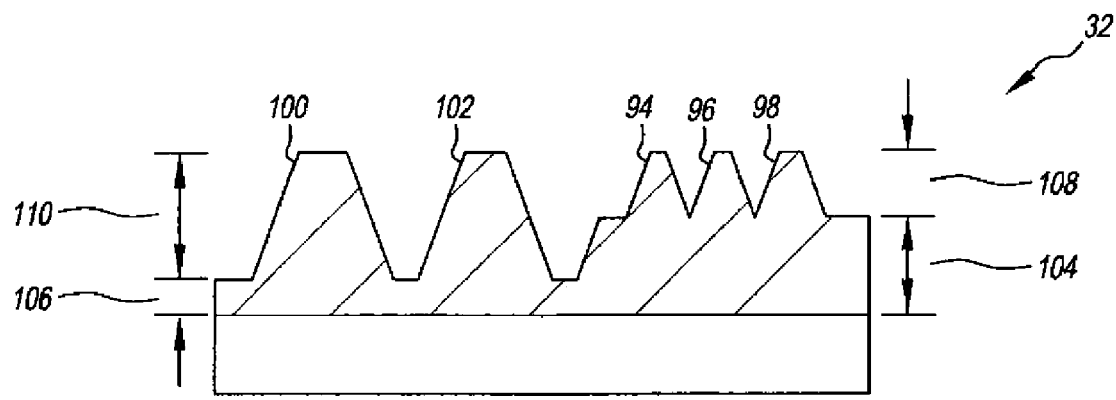
FIG. 9 is block diagram of a flexographic printing plate formed by development of the flexographic printing plate precursor of FIG. 8 according to one embodiment.

FIG. 9 illustrates flexographic printing plate 32' resulting from development of flexographic printing plate precursor 32. As illustrated, releasing layer 84 and uncured portions of photosensitive material 82 have been washed away, leaving the cured portions of photosensitive material 82 which correspond to exposed regions 70 of mask 50 and define the desired relief image on photosensitive substrate 80. As described earlier, the conical-shaped cured portions of photosensitive material 82 remaining after development are commonly referred to as highlight dots, illustrated as highlight dots 94, 96, 98, 100 and 102.

Referring to the example illustration of FIG. 6, highlight dots 94, 96, and 98 correspond to area 92 of mask 50 where the exposed or unmasked areas 70 have a highlight value at or below a given highlight threshold value, such as 2%, for instance, while highlight dots 100 and 102 correspond exposed areas 70 of mask 50 having a highlight value above the given highlight threshold value. As illustrated, due to curing radiation 90 being selectively applied by secondary back exposure unit 40 to area 92, the floor of the relief image in selected area 92 has a depth 104 which is greater than a "standard" floor depth 106 in non-selected areas (where the "standard" floor was formed exposing the entire back surface 33b to a pre-back exposure radiation). As a result, a relief depth 108 of highlight dots at or below the given highlight threshold value, such as highlight dots 94, 96, and 98, is less than a relief depth 110 of highlight dots above the given highlight threshold value.

By providing a higher floor (i.e. a reduced relief) for highlight dots having a highlight value at or below a given highlight threshold value, such as the reduced relief depth 108 associated with highlight dots 94, 96, and 98, additional floor structure is provided for such highlight dots. This additional floor structure provides added stability and enables such highlight dots to better survive the development process (e.g. less likely to be washed off during development) and enables a flexographic printing plate 32' resulting therefrom to retain highlight dots of a smaller size as compared to flexographic printing plates formed according to conventional processes. The additional support also helps to better maintain the physical integrity of such highlight dots during subsequent printing processes in which the flexographic printing plate 32' will be employed.

For example, according to one experiment, a Flexel NX mask was imagewise exposed and laminated to a Flexel SRH printing plate precursor (both available from Kodak Polychrome Graphics, Norwalk, Conn.) having a plate thickness of 0.067 inches. When a front or main exposure (e.g. such as by main exposure unit 38) of 8 minutes was employed, highlight dot retention was 2% (with a relative relief of approximately 80 microns) at 133 line screen for a 27 mil plate relief. When repeated in combination with a 20 second secondary back exposure using a UV LED array of 420 mW and a 370 nm wavelength (OTLH-0280-UV-10_A from Opto Technology, Wheeling, Ill.) done prior to the 8 minute front side exposure, highlight dot retention was reduced to 0.5% dots (with a relative relief of approximately 60 microns).

According to a second experiment, a 17 mm Flexel SRH flexographic printing plate precursor was back exposed for 11 seconds (for a nominal relief of 27 mils). An Optotek P150-3072 UV LED Printhead providing 40 mW total output power and having a measured output wavelength of 375 was then employed to additionally back expose a 0.5 inch wide swath at 1.6 mm/sec to provide a total relief of 12 mils. A 4 minute conventional front exposure (i.e. main exposure) was then made with TIL masks with a variety of highlight dot sizes and a 500 micron RLD feature.

Figure 10:
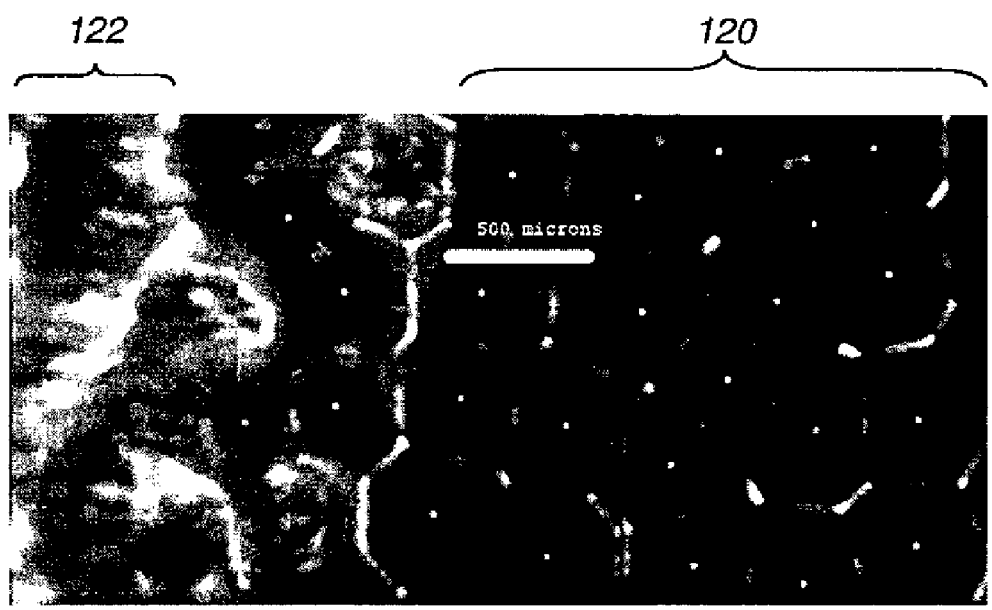
FIG. 10 is an image illustrating highlight dots in a flexographic print plate according to one embodiment.
Figure 11:
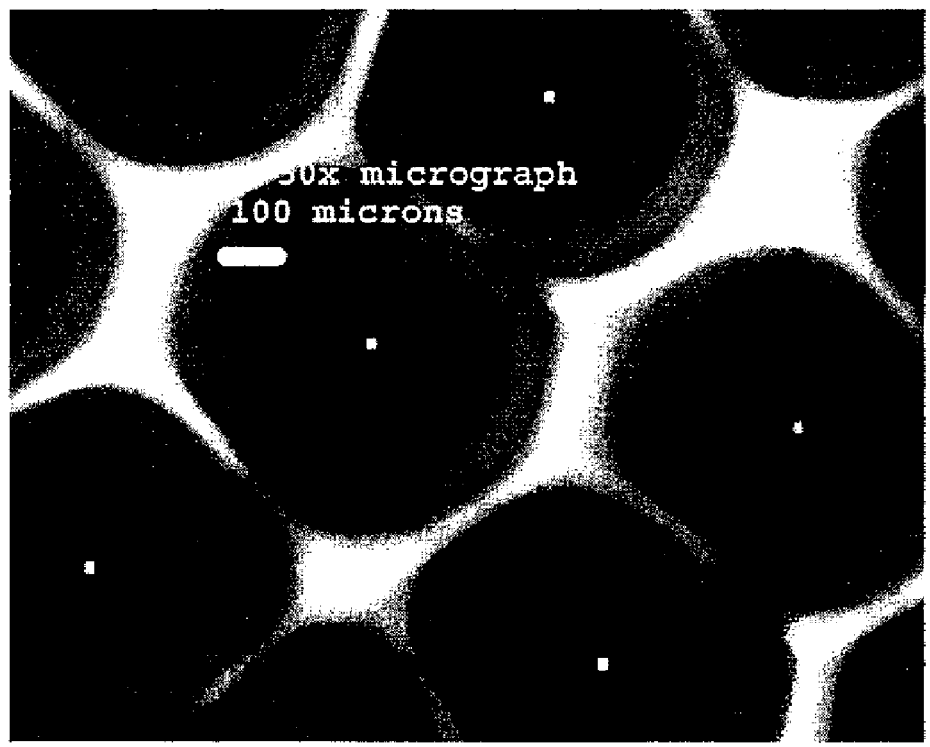
FIG. 11 is an image illustrating highlight dots in a flexographic print plate according to one embodiment.

As illustrated by the micrograph image of FIG. 10, 0.4% highlight dots of a 20 micron Staccato pattern held in the area of the printing plate having the higher floor produced by the selected exposure of the LED Printhead, as indicated at 120, while such highlight dots did not hold in an area having a lower floor, as indicated at 122. Furthermore, as illustrated by the image of FIG. 11, highlight dots of 0.15% held in the additionally exposed swath.

According to a third experiment, one half of a 0.67 Flexcel SRH NX photopolymer was pre-back exposed for 11 seconds in a Mekrom fluorescent light bank unit, which produced a nominal 29 mil relief, while the other half received no pre-back exposure. Next, a P150-3072 UV LED Printhead from Optotek, consisting of a staggered array of modules, each module having 32 LEDs and providing an output of 40 mW (about 1.25 mW/diode), and an overall LED spacing of 150 LEDs per inch, was scanned at three different speeds across the photopolymer (0.12, 0.18, and 0.26 cm/sec) to provide additional back exposure. The results are illustrated the graphs of FIGS. 12A and 12B.

Figure 12A:
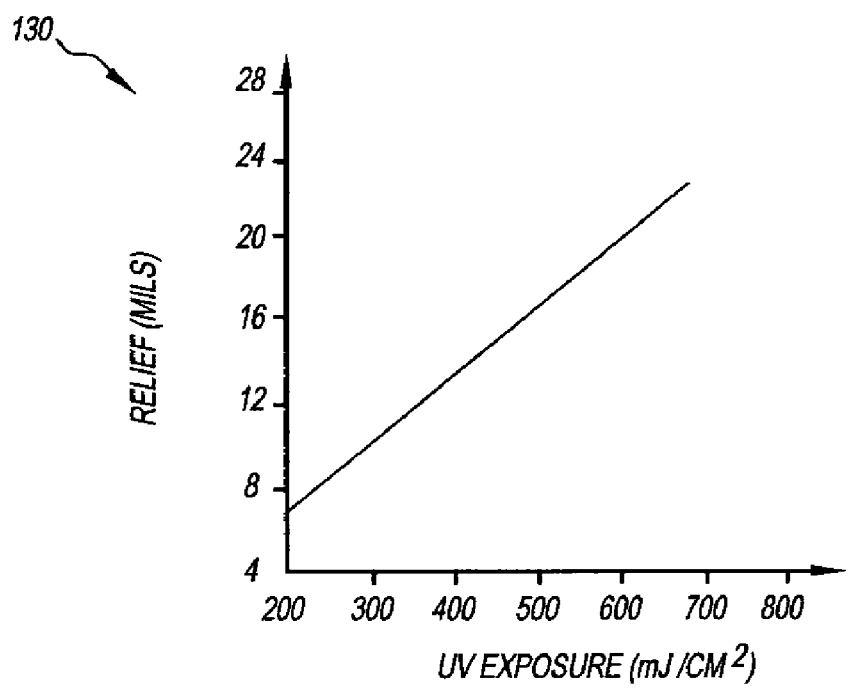
FIG. 12A is a graph illustrating a relief vs. ultraviolet exposure in a relief image.
Figure 12B:
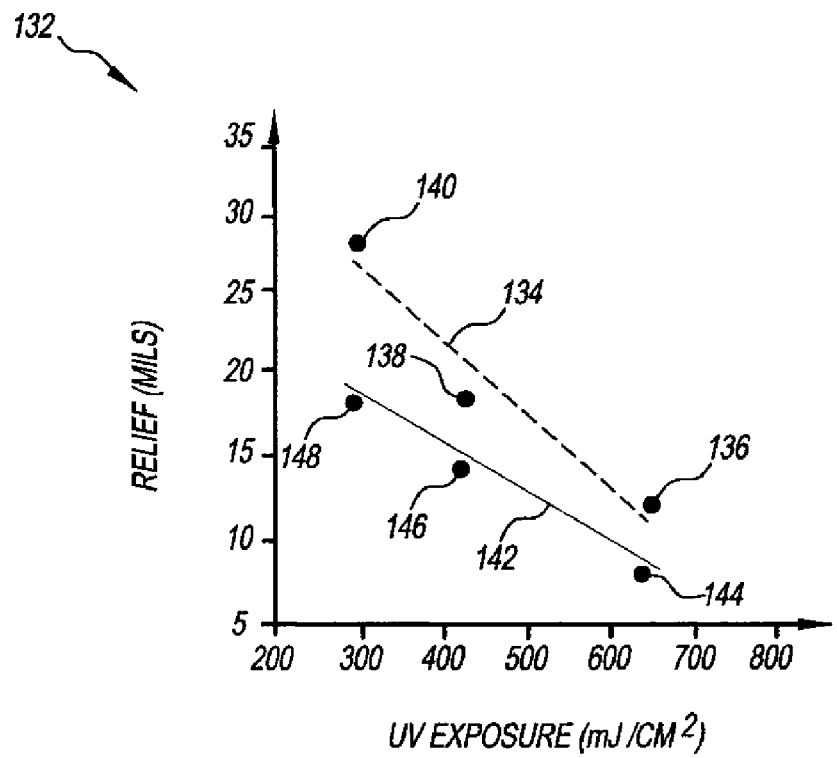
FIG. 12B is a graph illustrating a relief vs. ultraviolet exposure in a relief image.

FIG. 12A is a graph 130 illustrating the relief resulting only from back exposure provided by the LED printhead. FIG. 12B is a graph 132 illustrating the total relief resulting from a combination of conventional pre-back UV exposure and the additional back exposure provided by the LED printhead. A first curve 134 illustrates the relief resulting from back exposure provided only by the LED printhead, with data points 136, 138, and 140 corresponding to the increasing speeds at which the LED printhead scanned the photopolymer. A second curve 142 illustrates the relief resulting from the UV exposure provided by the LED printhead being combined with the conventional UV back exposure provided by the Mekrom fluorescent light bank unit, with data points 144, 146, and 148 corresponding to the increasing speeds at which the LED printhead scanned the photopolymer.

Figure 13:
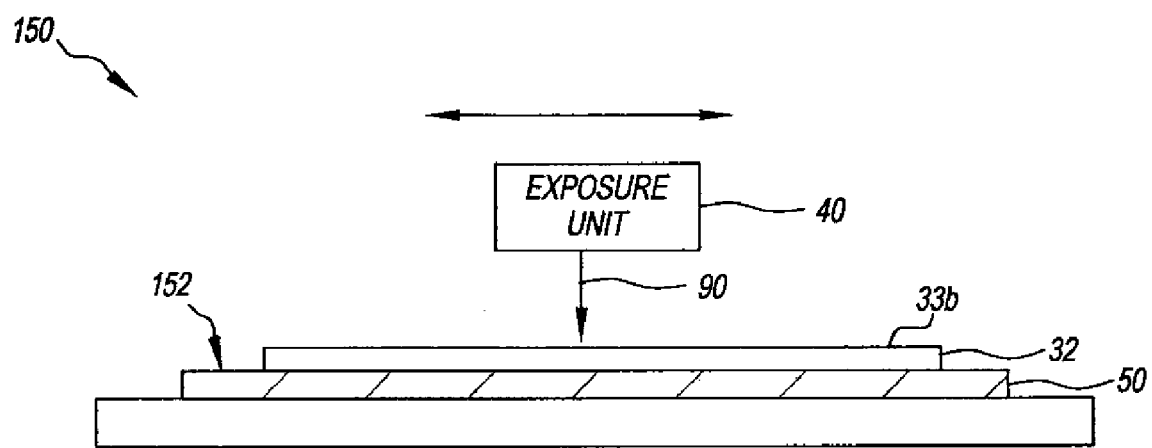
FIG. 13 is a block diagram of a system for back exposing a flexographic printing plate precursor according to one embodiment.

FIG. 13 illustrates an alternate system 150 for selectively back exposing backside surface 33b of flexographic printing plate precursor 32 using backside exposure unit 40. According to the embodiment of FIG. 13, in lieu of moving flexographic printing plate precursor 32 past main exposure unit 38, second back exposure unit 40 is instead moved and scanned across backside surface 33b of flexographic printing plate precursor 32, such as in the x- and y-directions. Again, backside exposure unit 40 is indexed or registered to mask 50, such as via a registration starting point 152. According to one embodiment, registration start point 152 is written into mask 50 and read by secondary back exposure unit 40 for accurate alignment of curing radiation 90 from secondary back exposure unit 40 with mask information.

In summary, by selectively back-exposing those areas of flexographic printing plate precursor 32 corresponding to exposed regions 70 of mask 50 which are at or below a given highlight value to radiation from backside exposure unit 40, system 30 is able to provide a resulting flexographic printing plate 32' which retains highlight dots of a smaller size (which might otherwise be washed off during development) as compared to conventional processes. The secondary selective back exposure provided by backside exposure unit 40 also reduces the exposure time required for the main or main exposure unit 38. For example, using only front exposure via main exposure unit 38, an exposure time of up to 30 minutes may be required, with an added disadvantage that some areas of the mask image may be over-exposed and result in areas of the developed mask having greater than intended highlight values. For example, in one instance, as described above, with a 20 second selected back exposure of flexographic print plate precursor 32 according to the present disclosure, an exposure time of only 8 minutes was required by main exposure unit 38.

The invention has been described in detail with particular reference to certain preferred embodiments thereof, but it will be understood that variations and modifications can be effected within the spirit and scope of the invention.

The invention claimed is:

1. A method of making a relief image on a flexographic print plate, the method comprising:
    imagewise exposing a mask including an imageable material disposed on a mask substrate to form an imaged mask having a mask image in the imageable material disposed on the mask substrate, the mask image including mask image areas each having a highlight value;
    laminating the imaged mask to a front surface of a flexographic printing plate precursor; and
    exposing only selected areas of the flexographic printing plate precursor that are indexed to the imaged mask to an imagewise addressable curing radiation via a back surface of the flexographic printing plate precursor based on the highlight values of corresponding mask image areas of the mask image.

2. The method of claim 1, wherein the selected areas comprise mask image areas having a highlight value at or below a highlight value threshold.

3. The method of claim 1, including exposing the entire back surface of the flexographic printing plate precursor to a curing radiation to form a substantially uniformly exposed layer of the flexographic printing plate precursor proximate to the back surface prior to exposing only selected areas of the flexographic printing plate precursor that are indexed to the imaged mask via the back surface.

4. The method of claim 1, including:
    exposing the flexographic printing plate precursor to curing radiation through the imaged mask;
    removing the imaged mask from the flexographic printing plate precursor; and
    developing the flexographic printing plate precursor to remove portions of the flexographic printing plate precursor unexposed to curing radiation to form the flexographic printing plate, the remaining exposed portions forming the relief image.

5. The method of claim 4, wherein exposing the selected areas of the flexographic printing plate precursor that are indexed to the imaged mask and exposing the flexographic printing plate precursor through the imaged mask is performed without vacuum drawdown.

6. A method of making a relief image on a flexographic print plate, the method comprising:
    imagewise exposing a mask including an imageable material disposed on a mask substrate to form an imaged mask having a mask image in the imageable material disposed on the mask substrate, the mask image including mask image areas each having a highlight value;
    laminating the imaged mask to a front surface of a flexographic printing plate precursor; and
    exposing only selected areas of the flexographic printing plate precursor that are indexed to the imaged mask to an imagewise addressable curing radiation via a back surface of the flexographic printing plate precursor based on the highlight values of corresponding mask image areas of the mask image, the imagewise addressable curing radiation being provided via a plurality of individually addressable radiation sources.

7. The method of claim 6, wherein the radiation sources comprise ultraviolet light sources.

8. The method of claim 6, wherein the individually addressable radiation sources comprises an array of ultraviolet light emitting diodes.

9. The method of claim 6, wherein the individually addressable radiation sources comprises a plurality of individually addressable optical fibers coupled to light sources.

10. The method of claim 6, wherein the individually addressable radiation sources comprise individually addressable micro mirrors of a digital light projector (DLP).

11. A method of forming a relief image on a flexographic print plate comprising
laminating an imaged mask having a mask image to a front surface of a flexographic printing plate precursor, the mask image having mask image areas each having a highlight value; and
exposing only selected areas of the flexographic printing plate precursor that are indexed to the imaged mask to an imagewise addressable curing radiation via a back surface of the flexographic printing plate precursor based on highlight values of corresponding mask image area of the mask image.

12. The method of claim 11, wherein the selected areas that are indexed to the imaged mask comprise mask image areas having a highlight value at or below a highlight value threshold.

13. The method of claim 11, including:
exposing the flexographic printing plate precursor to curing radiation in a flood-wise fashion through the imaged mask;
removing the imaged mask from the flexographic printing plate precursor; and
developing the flexographic printing plate precursor to remove portions of the flexographic printing plate precursor unexposed to curing radiation to form the flexographic printing plate, the remaining exposed portions forming the relief image.

14. The method of claim 11, wherein the imagewise addressable curing radiation comprises ultraviolet radiation provided by an array of individually addressable ultraviolet light emitting diodes.

15. The method of claim 1 wherein the selected areas that are indexed to the imaged mask comprise mask image areas having a highlight value at or below a highlight value of 2%.

* * * * *